United States Patent [19]

Yasuda et al.

[11] Patent Number: 4,578,800

[45] Date of Patent: Mar. 25, 1986

[54] SYNCHRONIZATION CIRCUIT FOR A VITERBI DECODER

[76] Inventors: Yutaka Yasuda, 7-50-40, Higashi-ohizumi, Nerima-ku, Tokyo; Yasuo Hirata, 13-39, Mure 5-chome, Mitaka-shi, Tokyo; Shuji Murakami, c/o NEC Corporation, 33-1, Shiba 5-chome, Minato-ku, Tokyo; Katsuhiro Nakamura, c/o NEC Corporation, 33-1, Shiba 5-chome, Minato-ku, Tokyo; Yukitsuna Furuya, c/o NEC Corporation, 33-1, Shiba 5-chome, Minato-ku, Tokyo, all of Japan

[21] Appl. No.: 511,503

[22] Filed: Jul. 6, 1983

[30] Foreign Application Priority Data

Jul. 12, 1982 [JP] Japan ................................. 57-120941
Jul. 12, 1982 [JP] Japan ................................. 57-120942

[51] Int. Cl.<sup>4</sup> ............................................. H04L 7/04
[52] U.S. Cl. ..................................... 375/106; 371/46; 375/118
[58] Field of Search ..................... 371/43, 44, 45, 46; 375/106, 118

[56] References Cited

U.S. PATENT DOCUMENTS 3,789,359 1/1974 Clark, Jr. et al. ..................... 371/46
3,872,432 3/1975 Bismarck .............................. 371/46

FOREIGN PATENT DOCUMENTS 2095517 9/1982 United Kingdom ................. 371/43

Primary Examiner—Joseph A. Orsino, Jr.

[57] ABSTRACT

A Viterbi decoder synchronization circuit comprises a phase shifter for introducing a variable amount of delay time to a received bit stream of convolutional codes in response to a control signal applied thereto with respect to a word synchronization signal which is derived from the bit stream. A first detector detects maximum and minimum metric values of the Viterbi decoder. A second detector detects the difference between the detected maximum and minimum metric values for coupling to an integrator. The output of the integrator is applied to a third detector which detects when the integrator output reaches a value indicative of a word-in-sync or word-out-of-sync condition. A phase shift signal is generated in response to an output signal from the third detector and applied to the phase shifter as the control signal.

7 Claims, 12 Drawing Figures

SYNCHRONIZATION CIRCUIT FOR A VITERBI DECODER

BACKGROUND OF THE INVENTION

The present invention relates to a synchronization circuit for a Viterbi decoder.

A convolution coder and decoder using the Viterbi algorithm can reduce error rates and increase the effective signal-to-noise ratio of a transmission system, and is particularly suitable for sattelite communication. The Viterbi decoder is described in detail in an article titled "The Viterbi Algorithm" on the Proceedings of the IEEE, Vol, 61, No. 3, March 1973, pages 268 to 278. The synchronization circuit for a Viterbi decoder is required not only to establish bit synchronization in which the received binary 1's and binary 0's have the same sequence of bit stream as the transmitted sequence of binary 1's and 0's, but also to establish word synchronization in which the binary 1's and 0's of the received code words are time coincident with the binary 1's and binary 0's of the transmitted code words. To establish word synchronization, it has been the usual practice to obtain a synchronization signal such as frame synchronization signals from PCM systems, for example. However, the synchronization format differs from system to system and as a result the synchronization circuit for a Viterbi decoder has been required to be custom designed to meet the particular format of the external system. If the synchronization signal is difficult to obtain from an external system, the application of a Viterbi decoder to such a system will be impossible.

SUMMARY OF THE INVENTION

It is therefore an object of the present invention to provide a synchronization circuit for a Viterbi decoder which eliminates the need for extracting synchronization signals from external sources.

A feature of the present invention is the provision of a synchronization circuit for a Viterbi decoder adapted to receive a bit stream of code words and having means for deriving a word synchronization signal from the received bit stream. The synchronization circuit comprises a phase shifter for introducing a variable amount of delay time to one of the bit stream and the word synchronization signal in response to a control signal applied thereto, and first detecting means for detecting a maximum metric value and a minimum metric value of the Viterbi decoder. A second detecting means is provided for detecting the difference between the detected maximum and minimum metric values for coupling to an integrator. A third detecting means detects when the output of the integrator reaches a value indicative of a word-in-sync or word-out-of-sync condition of the Viterbi decoder. A phase shift signal is generated in response to an output signal from the third detecting means and applied to the phase shifter as the control signal.

According to a further feature of the invention, the third detecting means comprises a comparator which compares the output signal of the integrator with a predetermined value and generates a comparator output as an indication of the word-out-of-sync condition when the predetermined value is reached. Different values of phase shift are represented by a series of recyclic binary codes. A memory is provided for storing the binary code in response to the comparator output and applying the stored binary code to the phase shifter. If the word-out-of-sync condition still continues, the next binary code will be stored in the memory and applied to the phase shifter and the process continues until a word-in-sync condition is established.

According to a still further feature of the invention, the third detecting means comprises a maximum value detector for detecting when the output signal of the integrator reaches a maximum value and generating an output signal as an indication of a word-in-sync condition. Different values of phase shift signal are represented by a series of recyclic binary codes. A memory stores the binary code in the absence of the output signal of the maximum value detector and applies the stored binary code to the phase shifter until the maximum value detector generates an output signal.

BRIEF DESCRIPTION OF THE DRAWINGS

The present invention will be described in further detail with reference to the accompanying drawings, in which.

DETAILED DESCRIPTION

Figure 1:
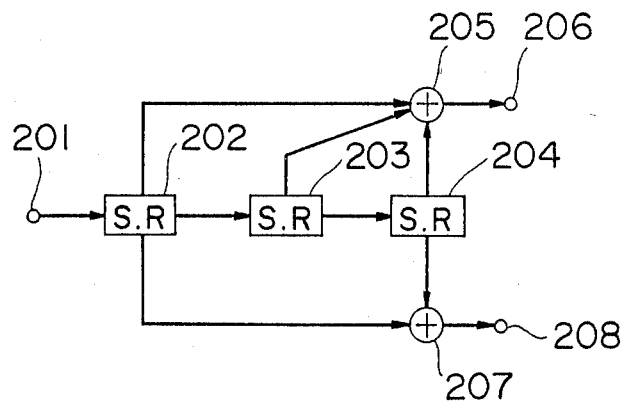
FIG. 1 is a block diagram of a known convolutional coder with which the Viterbi decoder of the invention is connected over parallel transmission channels and is presented for purposes of describing the operation of the Viterbi decoder of the present invention.
Figure 2:
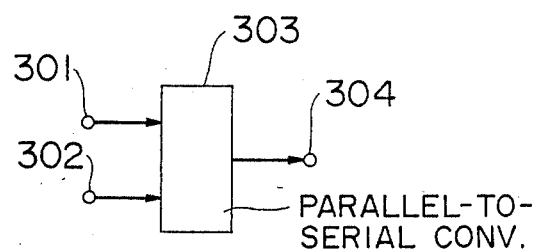
FIG. 2 is a block diagram of a parallel-to-serial converter to be used in conjunction with the convolutional coder of FIG. 1 if bit-serial transmission is desired.
Figure 3A:
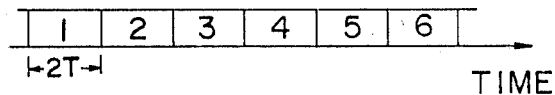
FIGS. 3a to 3c are schematic illustrations of the code formats of the transmitted and received digital signals and presented for the purpose of describing a word-in-sync and word-out-of-sync conditions.
Figure 3B:
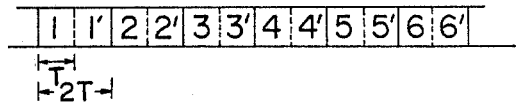

FIG. 1 is an illustration of a convolutional coder from which the Viterbi decoder of the present invention receives a coded signal. This convolutional coder is made up of three shift registers 202, 203 and 204 connected in series to receive a code signal at intervals 2T, as shown in FIG. 3a, at terminal 201, an Exclusive-OR gate 205 having its inputs connected to the outputs of shift registers 202, 203, 204, and an Exclusive-OR gate 207 whose input are connected to the outputs of shift registers 202 and 204. Rate-½ convolutional code words with a constraint length 3 are generated at terminals 206 and 208 as shown in FIG. 3b. The generated code words may be transmitted in parallel form or may be coupled to input terminals 301 and 302 of a parallel-to-serial converter 303 (FIG. 2). The output terminal 304 of the converter is coupled to a modulator, not shown, to modulate the code bits upon a carrier for transmission.

Figure 3C:
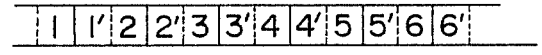

For proper decoding of the convolutional code it is necessary that a Viterbi decoder must establish bit synchronization as well as word synchronization. If the received code word is in serial form and is delayed by an interval T, the Viterbi decoder would recognize the delay input as a sequence of code words (1', 2)(2', 3)(3', 4) and so on as shown in FIG. 3c, and if in parallel form, a wrong pair of codes would be processed.

Figure 4:
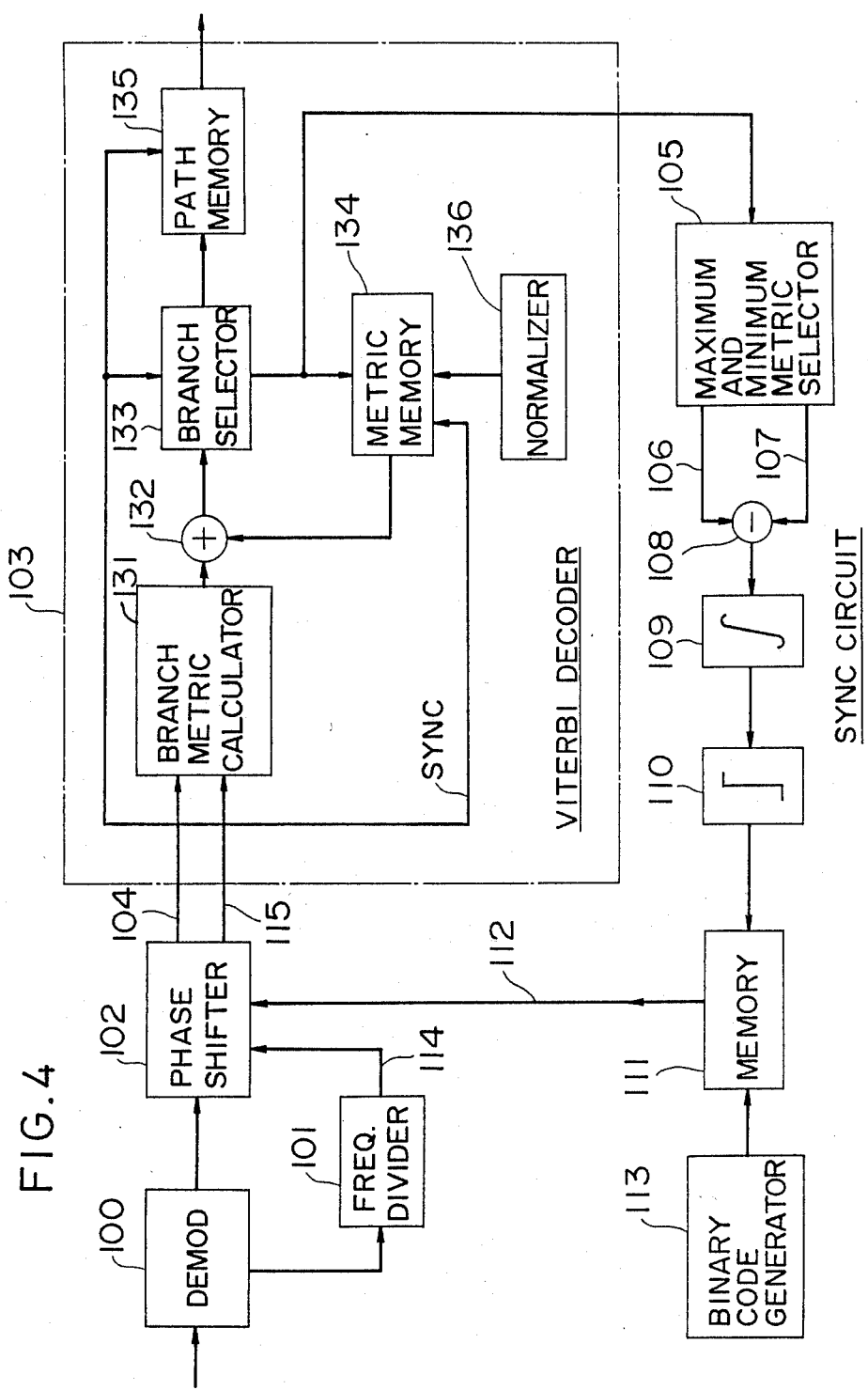
FIG. 4 is a block diagram of a first preferred embodiment of the present invention.

Referring to FIG. 4, there is shown a Viterbi decoder and a synchronization circuit constructed therefor according to a first embodiment of the present invention. The transmitted convolutional code words are demodulated by a demodulator 100 from which bit synchronization signal is derived for coupling to a ½ frequency divider 101 to provide a word synchronization signal to a word sync terminal 114. The demodulated convolutional code words are fed to a phase shifter 102. As will be described in detail later, the phase shifter 102 provides a phase-controlled sequence of bit streams to a line 104 and a word synchronization signal to a line 115.

To the phase shifter 102 is connected a known Viterbi decoder 103. The convolutional code signal from the phase shifter 102 is applied to a branch metric calculator 131 which receives the applied bit streams in response to the word sync signal to calculate the incremental value of each branch metric that can be taken. A metric memory 134 receives the output of a branch selector 133 to store the metric value of each "state" in the trellis diagram of the Viterbi algorithm and reads the stored value for coupling to an adder 132 where it is summed with the incremental metric value. The metric selector 133 is also synchronized to receive the output of the adder 132 to select the greater metric value (bit count) of the two metric branches connected to each "state". The metric value of the selected branch is applied to the metric memory 134 and to a path memory 135 which is also synchronized to store the selected metric path and deliver binary 1's and 0's as the selected path proceeds in the trellis diagram. The memory contents of the metric memory 134 is normalized by a normalizer 136 to prevent overflow.

To the output the branch selector 133 is connected a synchronization circuit constructed according to the present invention. The synchronization circuit comprises a maximum and minimum metric selector 105, a digital subtractor 108, a digital integrator 109, a digital threshold detector or comparator 110, a memory 111 and a binary code generator 113. The maximum and minimum metric selector 105 essentially comprises a memory for storing the metric values of the "states" that can be taken by the Viterbi decoder and a control unit that compares the stored values one against another to select the maximum value for coupling to a terminal 106 and select the minimum value for coupling to a terminal 107. The subtractor 108 is connected to the terminals 106 and 107 to detect the difference between the maximum and minimum metric values. The detected difference value is integrated by integrator 109 to provide a signal representing the average value of the difference. Due to this averaging effect fluctuations of the difference value are eliminated. The comparator 110 compares the output of the integrator 109 with a predetermined threshold level and feeds a write-enable pulse to the memory 111 to write phase shifting information from the code generator 113 when the integrator output drops to the threshold level.

The binary code generator 113 generates a series of recyclic binary codes representing different amounts of phase shift. When the memory 111 is enabled a phase shift binary code is stored therein and supplied to the phase shifter 102 as a phase control signal.

Figure 5:
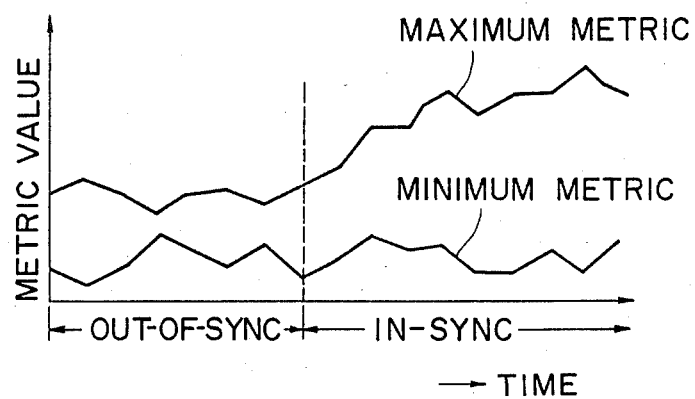
FIG. 5 is a graphic illustration of the maximum and minimum metrics as a function of time during word-out-of-sync and word-in-sync conditions.
Figure 6:
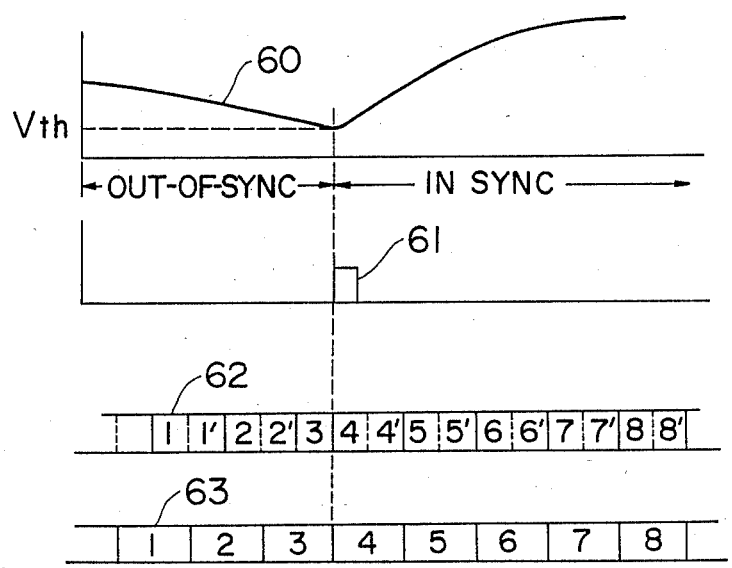
FIG. 6 is a timing diagram useful for describing the operation of the synchronization circuit of FIG. 4.

The operation of the embodiment will be understood from the following description which is given with reference to FIGS. 5 and 6. It is found that when the received signal is out of word sync as shown at FIG. 3c, the metric values will vary such that the difference between maximum and minimum metrics is relatively small, and when the Viterbi decoder is word-synchronized the difference value increases in a manner as shown in FIG. 5. Therefore, if the Viterbi decoder 103 is out of word-sync, the integrator output shown at 60 in FIG. 6 reaches the threshold level Vth of the comparator 110, and the latter generates a write-enable pulse 61. Thus, during word-in-sync conditions the comparator 110 provides a write-disable signal to the memory 111 to cause it to retain its stored value. A code format shown at 62 in FIG. 6 represents the convolutional code words at the input terminal 104. In response to the write-enable pulse the memory 111 updates its stored code with a phase shift binary code which has been incremented by one during previous interval and applies the incremented binary code through a line 112 to the phase shifter 102. The phase shifter 102 introduces a one-bit delay time to the bit stream of the convolutional code words on line 104. If the Viterbi decoder is out of sync by a one-bit interval, a word sync condition will be quickly synchronized with the transmitted code bits 63 in response to the write-enable pulse. If the decoder is out of sync by a two-bit interval, the word-out-of-sync condition still exists and the binary code generator 113 will be further incremented by one and the memory 111 is updated with the incremented binary code to introduce a two-bit interval. Once the system enters a word-in-sync condition, the comparator 110 generates a write-disable signal to the memory 111 to operate the Viterbi decoder with the most recent phase shift value.

Figure 7:
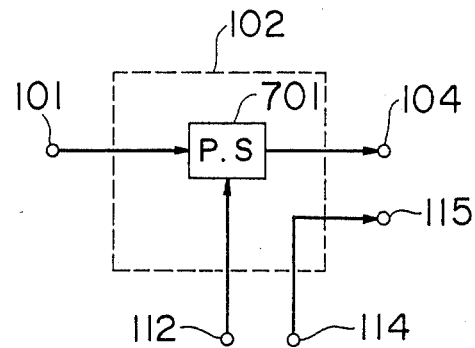
FIGS. 7 and 8 are block diagrams of the phase shifter of FIG. 4.
Figure 8:
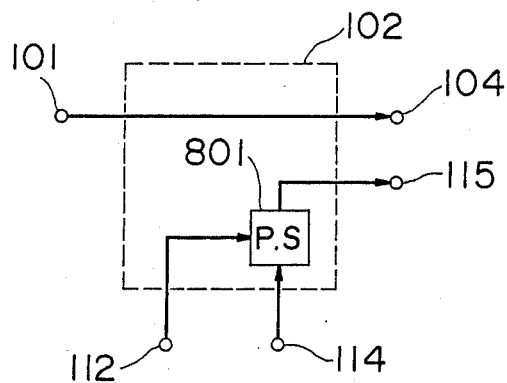

FIGS. 7 and 8 are illustrations of examples of the phase shifter 102. In FIG. 7, the phase shifter comprises a digital delay circuit 701 which introduces an incremental delay time in response to the binary code supplied on line 112 from the memory 111 and the word sync signal on line 114 is applied direct to the word sync terminal 115 of the Viterbi decoder 103. In FIG. 8, the convolutional code words on terminal 101 are applied directly to the terminal 104 of the Viterbi decoder 103. A digital delay circuit 801 is arranged to delay the word synchronization signal on terminal 114 in response to the binary code on terminal 112 and supplies the delayed word sync to the terminal 115.

Figure 9:
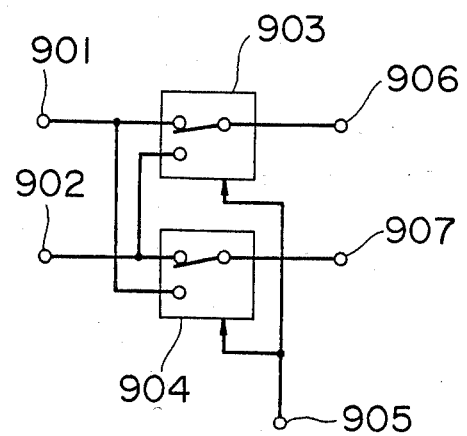
FIG. 9 is a circuit diagram of a phase shifter which is used when the convolutional code is transmitted in parallel form.

FIG. 9 is an illustration of a phase shifter 102 in the case of parallel transmission in which the output terminals 206 and 208 of the convolutional coder are coupled by separate channels to the demodulator 100. The phase shifter 102 for the parallel transmission comprises a pair of terminals 901 and 902 which are coupled to the terminals 206 and 208 respectively and a pair of switches 903 and 904 which are arranged to reverse their connections from the input terminals 901 and 902 to output terminals 906 and 907 in response to a switching signal applied to a terminal 905.

Figure 10:
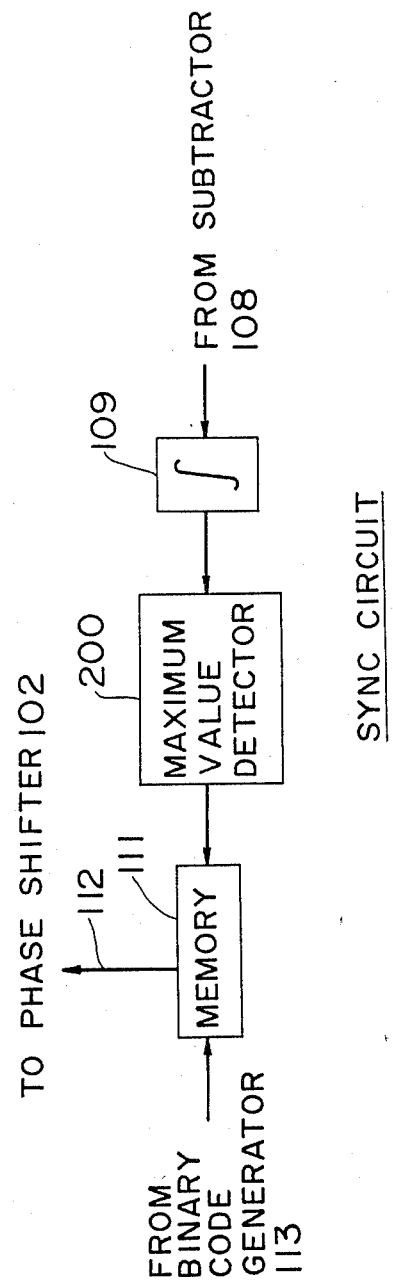
FIG. 10 is a block diagram of a second preferred embodiment of the present invention.

FIG. 10 is an illustration of a second embodiment of the synchronization circuit which is generally similar to that shown in FIG. 4 with the exception that a maximum value detector 200 is used instead of the comparator 110. Since the difference between the maximum and minimum metric values during word-out-of-sync conditions is smaller than that during word-in-sync conditions, the maximum value detector 200 provides a write-enable signal during word-out-sync conditions to the memory 111 to cause it to by updated with the most recent value of the incremental binary code from the binary code generator 113 and apply the stored binary code to the phase shifter 102. This updating continues as long as the word-out-of-sync condition exists and the Viterbi decoder seeks word synchronization. Once the Viterbi decoder is word synchronized, the difference between the maximum and minimum metrics increases, resulting in a maximum value to appear at the output of the integrator 109. The maximum value detector 200 now provides a write-disable signal to the memory 111 to cause it to retain the most recent phase shift value to keep the Viterbi decoder in synchronism.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A synchronization circuit for a Viterbi decoder adapted to receive bit stream of code words and having means for deriving a word synchronization signal from said bit stream, said Viterbi decoder having a trellis diagram representing a series of a plurality of metric branches, said circuit comprising:
    a phase shifter responsive to the receipt of said bit stream and said word synchronization signal for introducing a delay time to one of said bit stream and said word synchronization signal in response to a control signal applied thereto;
    first detecting means for detecting a maximum metric value and a minimum metric value of said Viterbi decoder which have occurred in said trellis diagram over a series of said metric branches;
    second detecting means for detecting the difference between said detected maximum and minimum metric values;
    integrating means for integrating said detected difference;
    third detecting means for detecting when the output signal of said integrating means reaches a value indicative of one of word-in-sync and word-out-of-sync conditions of said Viterbi decoder; and
    means for generating a phase shift signal in response to an output signal from said third detecting means and for applying said phase shift signal to said phase shifter as said control signal.

2. The synchronization circuit as claimed in claim 1, wherein said third means comprises means for detecting when the output of said integrating means reaches one of two extreme values of integration respectively indicating word-in-sync and word-out-of-sync conditions and for providing an output signal indicating the detection of one of said word-in-sync and word-out-of-sync conditions.

3. A synchronization circuit as claimed in claim 1, wherein said third detecting means comprises a comparator for comparing the output signal of said integrating means with a predetermined value and generating a comparator output signal as an indication of the word-out-of-sync condition when the predetermined value is reached.

4. A synchronization circuit as claimed in claim 3, wherein said phase shift signal generating means comprises binary code generating means for generating a series of recyclic binary codes representing different values of phase shift and memory means for storing a said binary code in response to said comparator output signal and applying the stored binary code to said phase shifter as said control signal.

5. A synchronization circuit as claimed in claim 4, wherein said memory means is arranged to be disabled during said word-in-sync condition to successively store and apply the binary codes to said phase shifter.

6. A synchronization circuit for a Viterbi decoder adapted to receive a bit stream of code words and having means for deriving a word synchronization signal from said bit stream, said Viterbi decoder having a trellis diagram represented by a series of a plurality of metric branches, said circuit comprising:
    a phase shifter responsive to the receipt of the bit stream and said word synchronization signal for introducing a delay time to one of said bit stream and said word synchronization signal in response to a control signal applied thereto;
    first detecting means for detecting a maximum metric value and a minimum metric value of said Viterbi decoder which have occurred in said trellis diagram over a series of said metric branches;
    second detecting means for detecting the difference between said detected maximum and minimum metric values;
    integrating means for integrating said detected difference;
    third detecting means for detecting when the output signal of said integrating means reaches a value indicative of one of word-in-sync and word-out-of-sync conditions of said Viterbi decoder, wherein said third detecting means comprises maximum value detecting means for detecting when the output signal of said integrating means reaches a maximum value and generating an output signal as an indication of said word-in-sync condition; and
    means for generating a phase shift signal in response to an output signal from said third detecting means and for applying said phase shift signal to said phase shifter as said control signal.

7. A synchronization circuit as claimed in claim 6, wherein said phase shift signal generating means comprises binary code generating means for generating a series of recyclic binary codes representing different values of phase shift and memory means for storing a said binary code in the absence of the output signal of said maximum value detecting means and applying the stored binary code to said phase shifter as said control signal until the time of occurrence of the output signal of said maximum value detecting means.

* * * * *

UNITED STATES PATENT AND TRADEMARK OFFICE
CERTIFICATE OF CORRECTION

PATENT NO. : 4,578,800

DATED : March 25, 1986

INVENTOR(S) : Yasuda et al

It is certified that error appears in the above—identified patent and that said Letters Patent is hereby corrected as shown below:

On The Title Page Insert:

-- Assignee: KOKUSAI DENSHIN DENWA CO., LTD., Tokyo, Japan and

NEC CORPORATION, Tokyo, Japan. --.

Signed and Sealed this

Twenty-fourth Day of October, 1989

Attest:

DONALD J. QUIGG

*Attesting Officer*      *Commissioner of Patents and Trademarks*